United States Patent
Chen et al.

(10) Patent No.: US 9,147,480 B2
(45) Date of Patent: Sep. 29, 2015

(54) CURRENT SENSING TYPE SENSE AMPLIFIER AND METHOD THEREOF

(75) Inventors: Chung-Kuang Chen, Hsin-chu (TW); Han-Sung Chen, Hsin-chu (TW); Chun-Hsiung Hung, Hsin-chu (TW)

(73) Assignee: MACRONIX INTERNATIONAL CO., LTD. (TW)

( * ) Notice: Subject to any disclaimer, the term of this patent is extended or adjusted under 35 U.S.C. 154(b) by 0 days.

(21) Appl. No.: 13/328,010

(22) Filed: Dec. 16, 2011

(65) Prior Publication Data
US 2013/0155777 A1  Jun. 20, 2013

(51) Int. Cl.
*G11C 16/24* (2006.01)
*G11C 16/26* (2006.01)
*G11C 16/32* (2006.01)

(52) U.S. Cl.
CPC .............. *G11C 16/26* (2013.01); *G11C 16/24* (2013.01); *G11C 16/32* (2013.01)

(58) Field of Classification Search
CPC ................................ G11C 16/24; G11C 16/26
USPC ............ 365/185.21, 185.25, 189.15, 189.06, 365/206
See application file for complete search history.

(56) References Cited

U.S. PATENT DOCUMENTS

| | | | |
|---|---|---|---|
| 6,097,638 A * | 8/2000 | Himeno et al. | 365/185.25 |
| 6,330,189 B1 * | 12/2001 | Sakui et al. | 365/185.22 |
| 2002/0158660 A1 * | 10/2002 | Jang et al. | 326/33 |
| 2004/0000944 A1 * | 1/2004 | Cho | 327/391 |
| 2004/0057310 A1 * | 3/2004 | Hosono et al. | 365/202 |
| 2005/0213381 A1 * | 9/2005 | Byeon | 365/185.11 |
| 2006/0114733 A1 * | 6/2006 | Hosono | 365/206 |
| 2008/0043524 A1 * | 2/2008 | Maejima et al. | 365/185.01 |
| 2008/0080239 A1 * | 4/2008 | Shibata | 365/185.03 |
| 2008/0225618 A1 * | 9/2008 | Hosono et al. | 365/207 |
| 2009/0040834 A1 * | 2/2009 | Ogawa | 365/185.21 |
| 2009/0040835 A1 * | 2/2009 | Ogawa | 365/185.21 |
| 2009/0052254 A1 * | 2/2009 | Hosono et al. | 365/185.18 |
| 2009/0244974 A1 * | 10/2009 | Kawamoto et al. | 365/185.09 |
| 2009/0244978 A1 * | 10/2009 | Yoshihara et al. | 365/185.21 |
| 2009/0323420 A1 * | 12/2009 | Lee et al. | 365/185.17 |
| 2009/0323421 A1 * | 12/2009 | Lee et al. | 365/185.17 |
| 2011/0051517 A1 * | 3/2011 | Mui et al. | 365/185.17 |
| 2011/0051518 A1 * | 3/2011 | Fujimura | 365/185.17 |
| 2011/0188317 A1 * | 8/2011 | Mui et al. | 365/185.22 |

* cited by examiner

*Primary Examiner* — Hoai V Ho
*Assistant Examiner* — Jay Radke
(74) *Attorney, Agent, or Firm* — Volpe and Koenig, P.C.

(57) ABSTRACT

The configurations of sense amplifier and methods thereof are provided. The proposed sense amplifier includes a switch circuit having a main control switch, a sensing switch and a holding switch, wherein the three switches have a first bias, a second bias and a third bias respectively, and an auxiliary control switch electrically connected to the holding switch to control an operation of the holding switch.

17 Claims, 7 Drawing Sheets

CURRENT SENSING TYPE SENSE AMPLIFIER AND METHOD THEREOF

FIELD OF THE INVENTION

The present invention relates to a current sensing type sense amplifier. More particularly, it relates to a current sensing type sense amplifier having a better efficiency and a lower power loss.

BACKGROUND OF THE INVENTION

For a non-volatile memory, such as a NAND flash memory or a NOR flash memory, data in a storage cell is read via a bit line connected to the storage cell by a sense amplifier. FIG. 1(a) shows a circuit diagram of a sense amplifier and a NAND flash memory in the prior art.

In FIG. 1 (a), a NAND flash memory 10 and a sense amplifier including a clamping circuit 21 are shown. The NAND flash memory 10 includes a DGS (drain gate select), a SGS (source gate select) and plural storage cells. The sense amplifier includes switches sw1-sw3 and sw5-sw8, a capacitor C, and a latch circuit including two cross-connected inverters IN1 and IN2. The switches sw1-sw3 are used to clamp the bit line and receive the first to the third bit line clamping biases BLC1, BLC2 and BLC3 respectively. The switch sw5 receives the signal LPC. When the switch sw5 is turned on, the potential value of the second terminal of the latch circuit SENB is transferred to the node SEN. The sense amplifier further includes a sensing and pre-charging path sw8-sw1-sw3-sw7, a holding path sw8-sw1-sw2-the latch circuit and a strobe path sw6-sw7-SENB. The sensing and pre-charging path is used to sense a potential value of a specific storage cell connected to a bit line in the NAND flash memory at the node SEN so as to show whether the storage cell is in a conductive status or a non-conductive status. The storage cell generates a current and has a relatively low potential value when the storage cell is in a conductive status, and the storage cell does not generate any current and has a relatively high potential value when the storage cell is in a non-conductive status. Due to a charge sharing status, the node SEN will show the potential value of the specific storage cell being read out. The holding path pre-charges the bit line to a first pre-determined potential value. The switch sw6 of the strobe path receives a power supply voltage VDD and a control signal STR for controlling the strobe path, and the switch sw7 of the strobe path is used to judge whether the sensing and pre-charging path is in a conductive status, or in a non-conductive status. FIG. 1(a) further shows a metal bit line is connected with the bit line connected to the DGS and the plural storage cells, and switch sw8 (a bit line select) at node MBL, and shows a common source line (CSL).

FIG. 1(b) shows simulation waveforms of potential values of signals BLC1, BLC2, BLC3 and LPC, and potential values of nodes MBL, SEN, SENA, STR and SENB: v(BLC1), v(BLC2), v(BLC3), v(LPC), v(MBL), v(SEN), v(SENA), v(STR) and v(SENB) as shown in the circuit diagram of FIG. 1(a). In the marked region, a large voltage drop is shown. Such a voltage drop results from the design of having three bit line clamping biases BLC1, BLC2, BLC3 and two cascode paths. One of the two cascode paths is from BLC1 to BLC3, and the other one is from the BLC1 to BLC2 as shown in FIG. 1(a). Due to that VDD is not big enough at the marked region with bigger voltage drops, it is necessary to boost the voltage of SEN to ensure that the devices on the two cascode paths would be operated in the saturation region so as to result in the extra losses of raising the voltage, and this is what should be improved. FIG. 1(b) is during pre-charging of the nodes SENA and SEN by the latch.

Keeping the drawbacks of the prior arts in mind, and employing experiments and research full-heartily and persistently, the applicant finally conceived a current sensing type sense amplifier and method thereof.

SUMMARY OF THE INVENTION

It is therefore an object of the present invention to provide a current sensing type sense amplifier having a better efficiency and a lower power loss, and the efficiency is raised and the power loss is reduced via adding an auxiliary control switch to control a holding path more accurately.

According to a first aspect of the present invention, a sense amplifier comprises a first switch having a first terminal, a second terminal and a control terminal receiving a first bias, a second switch having a first terminal electrically connected to the first terminal of the first switch, a second terminal and a control terminal receiving a second bias, a third switch having a first terminal, a second terminal electrically connected to the first terminal of the first switch and a control terminal receiving a third bias, a holding path including the second switch, and a fourth switch controlling a turn-on and a turn-off of the holding path and having a first terminal electrically connected to the second terminal of the second switch, a second terminal and a control terminal receiving a sensing signal.

According to a second aspect of the present invention, a sense amplifier having a clamping circuit comprises a main control switch having a first bias to decide whether or not the clamping circuit should operate, a sensing switch electrically connected to the main control switch and having a second bias, and a holding switch electrically connected to the main control switch and the sensing switch, and having a third bias, wherein the first bias is different from the second bias, and the second bias equals to the third bias.

According to a third aspect of the present invention, a sense amplifier comprises a switch circuit having a main control switch, a sensing switch and a holding switch, wherein the three switches have a first bias, a second bias, and a third bias respectively, and an auxiliary control switch electrically connected to the holding switch to control an operation of the holding switch.

According to a fourth aspect of the present invention, a method for a sense amplifier comprises steps of: forming a holding path including a main control switch and a holding switch; and providing an auxiliary control switch to control a turn-on and a turn-off of the holding path.

The present invention may best be understood through the following descriptions with reference to the accompanying drawings, in which:

DETAILED DESCRIPTION OF THE PREFERRED EMBODIMENT

Figure 2A:
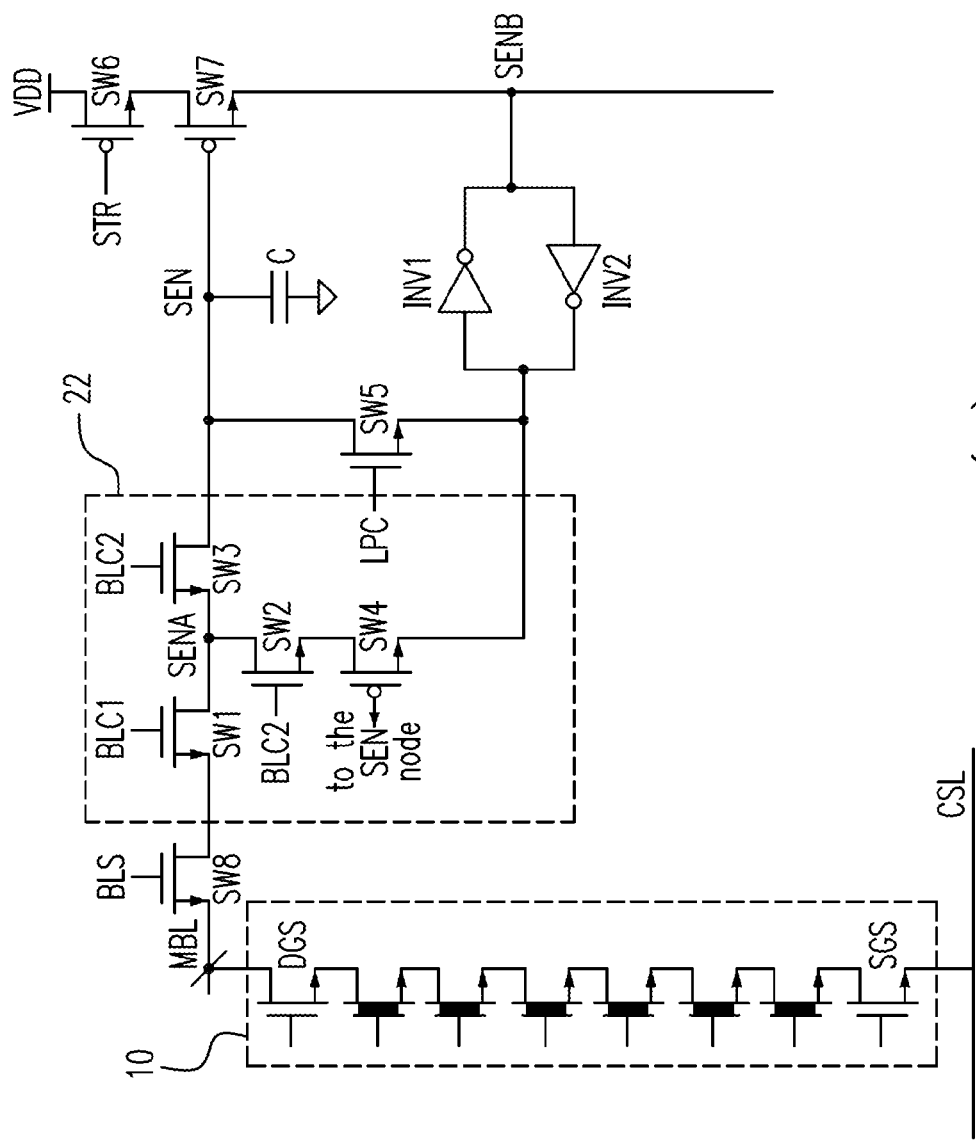
FIG. 2(a) is a circuit diagram of a sense amplifier and a NAND flash memory according to the first preferred embodiment of the present invention.

FIG. 2(a) shows a circuit diagram of a sense amplifier and a NAND flash memory according to the first preferred embodiment of the present invention. In FIG. 2(a), it shows the NAND flash memory 10 and a sense amplifier including a clamping circuit 22, which differs from the sense amplifier including the clamping circuit 21 in the prior art in that the clamping circuit 22 has only two bit line clamping biases, i.e. BLC1 and BLC2, and an auxiliary control switch sw4 is added. The switch sw4 is used to control a turn-on and a turn-off of the holding path sw8-sw1-sw2-sw4-the latch circuit more accurately. The present preferred embodiment also utilizes various channel lengths to solve the offset issue of the threshold voltage of the switch sw2.

Figure 1A:
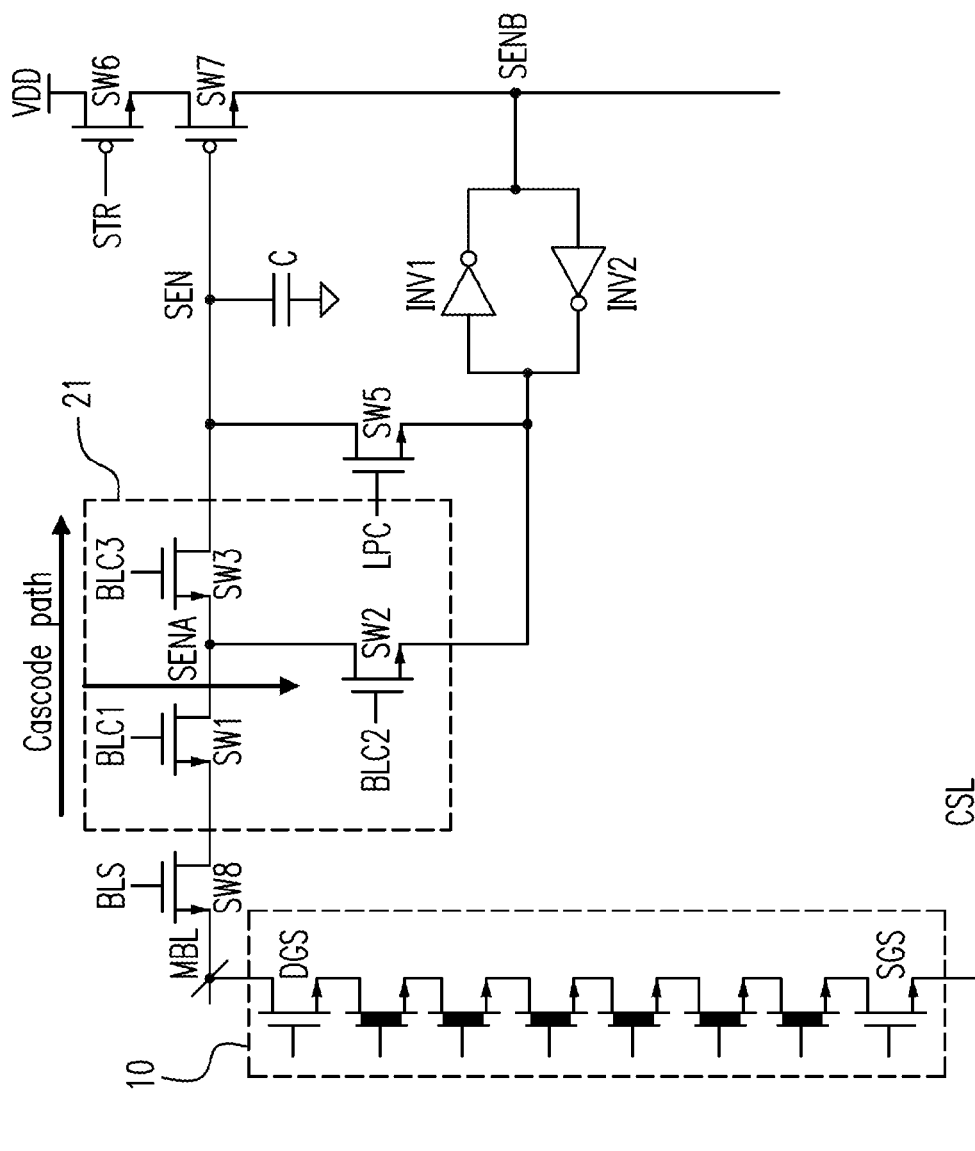
FIG. 1(a) is a circuit diagram of a sense amplifier and a NAND flash memory in the prior art.
Figure 1B:
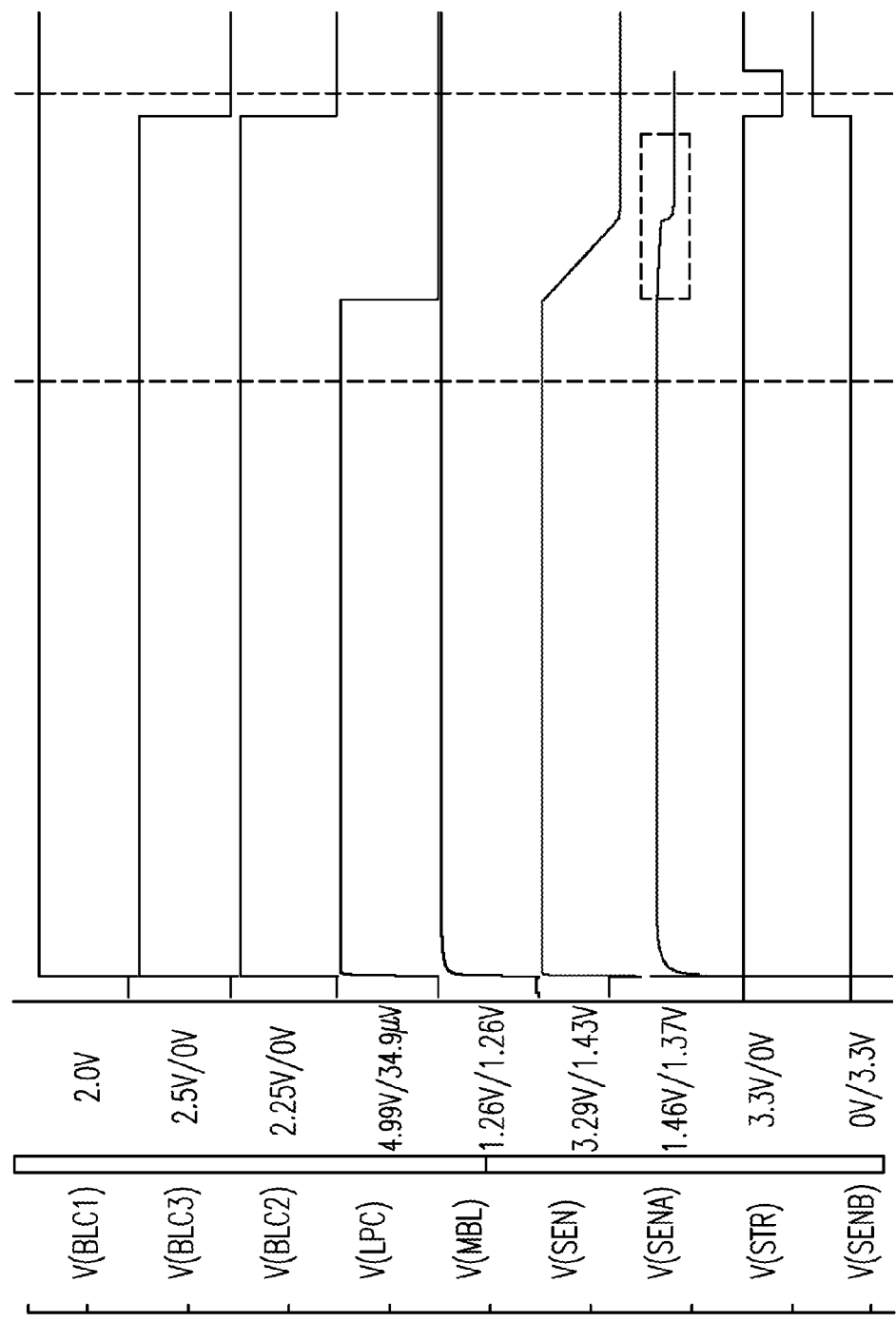
FIG. 1(b) shows simulation waveforms of potential values of signals BLC1, BLC2, BLC3 and LPC, and potential values of nodes MBL, SEN and SENA: v(BLC1), v(BLC2), v(BLC3), v(LPC), v(MBL), v(SEN) and v(SENA) as shown in the circuit diagram of FIG. 1(a)
Figure 2B:
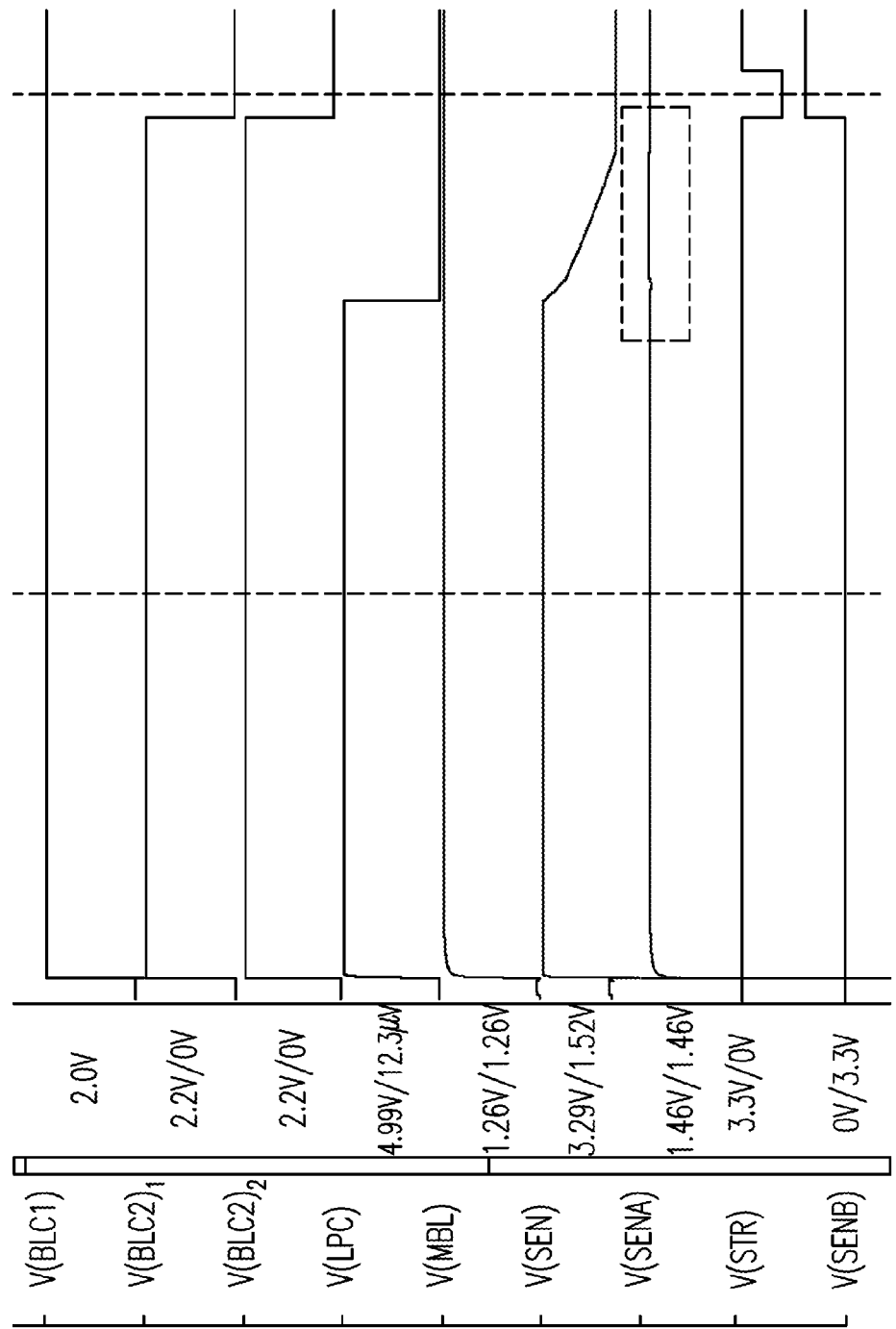
FIG. 2(b) shows simulation waveforms of potential values of signals BLC1, (BLC2)1, (BLC2) and LPC, and potential values of nodes MBL, SEN and SENA: v(BLC1), v(BLC2)1, v(BLC2)2, v(LPC), v(MBL), v(SEN) and v(SENA) as shown in the circuit diagram of FIG. 2(a)

FIG. 2(b) shows simulation waveforms of potential values of signals BLC1, (BLC2)1 (of the switch sw2), (BLC2)2 (of the switch sw3) and LPC, and potential values of nodes MBL, SEN and SENA: v(BLC1), v(BLC2)1, v(BLC2)2, v(LPC), v(MBL), v(SEN) and v(SENA) as shown in the circuit diagram of FIG. 2(a). In FIG. 2(b), the voltage drops in the marked region of v(SENA) is 1 order smaller than that of FIG. 1(b) to avoid the aforementioned extra power losses caused by raising the voltage of the sense amplifier in the prior art.

Figure 3:
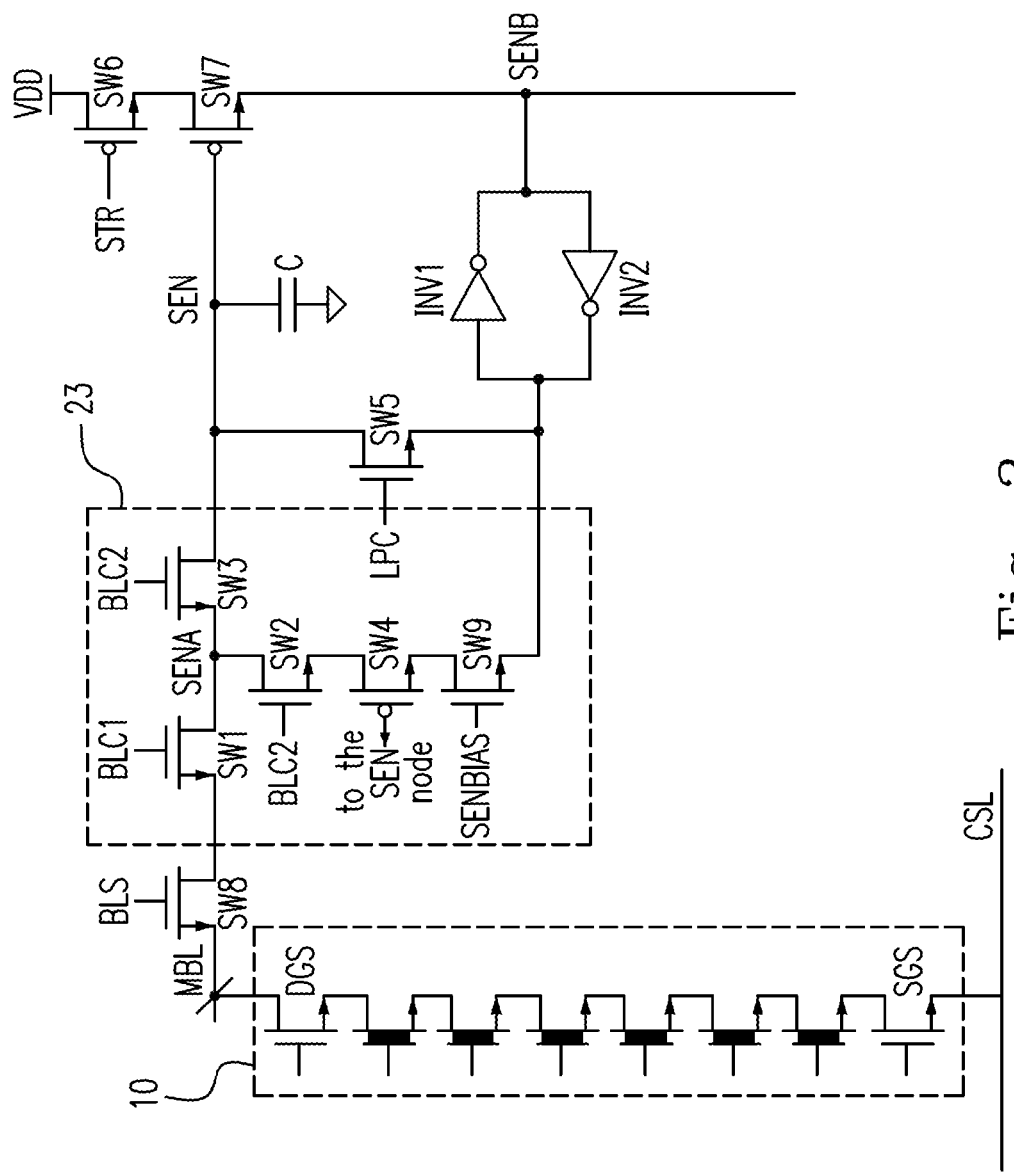
FIG. 3 is a circuit diagram of a sense amplifier and a NAND flash memory according to the second preferred embodiment of the present invention.

FIG. 3 shows a circuit diagram of a sense amplifier and a NAND flash memory according to the second preferred embodiment of the present invention. In FIG. 3, it shows the NAND flash memory 10 and a sense amplifier including a clamping circuit 23, which differs from the sense amplifier including the clamping circuit 22 in that a switch sw9 is added in the clamping circuit 23 so as to control a turn-on timing of the holding path sw8-sw1-sw2-sw4-sw9-the latch circuit more accurately via the bias SENBIAS received by the gate of the switch sw9.

Figure 4:
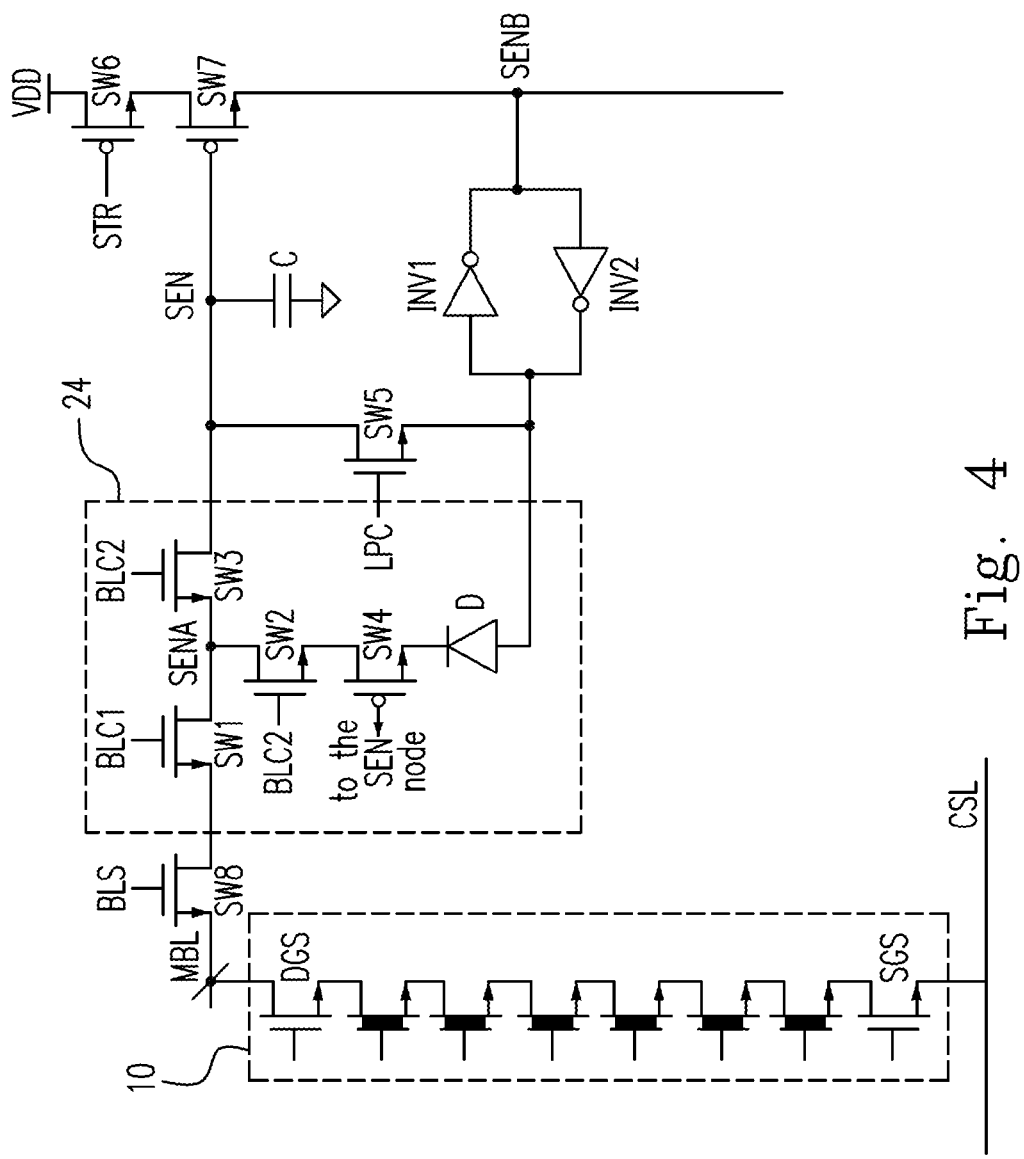
FIG. 4 is a circuit diagram of a sense amplifier and a NAND flash memory according to the third preferred embodiment of the present invention.

FIG. 4 shows a circuit diagram of a sense amplifier and a NAND flash memory according to the third preferred embodiment of the present invention. In FIG. 4, it shows the NAND flash memory 10 and a sense amplifier including a clamping circuit 24, which differs from the sense amplifier including the clamping circuit 23 in that a diode D is added in the clamping circuit 23 to replace the switch sw9. The voltage drop of the diode D is fixed such that the effect of which might be a little bit less effective than that of switch sw9, but the cost of a diode is cheaper than that of a switch in general, and thus it is a feasible alternative.

Figure 5:
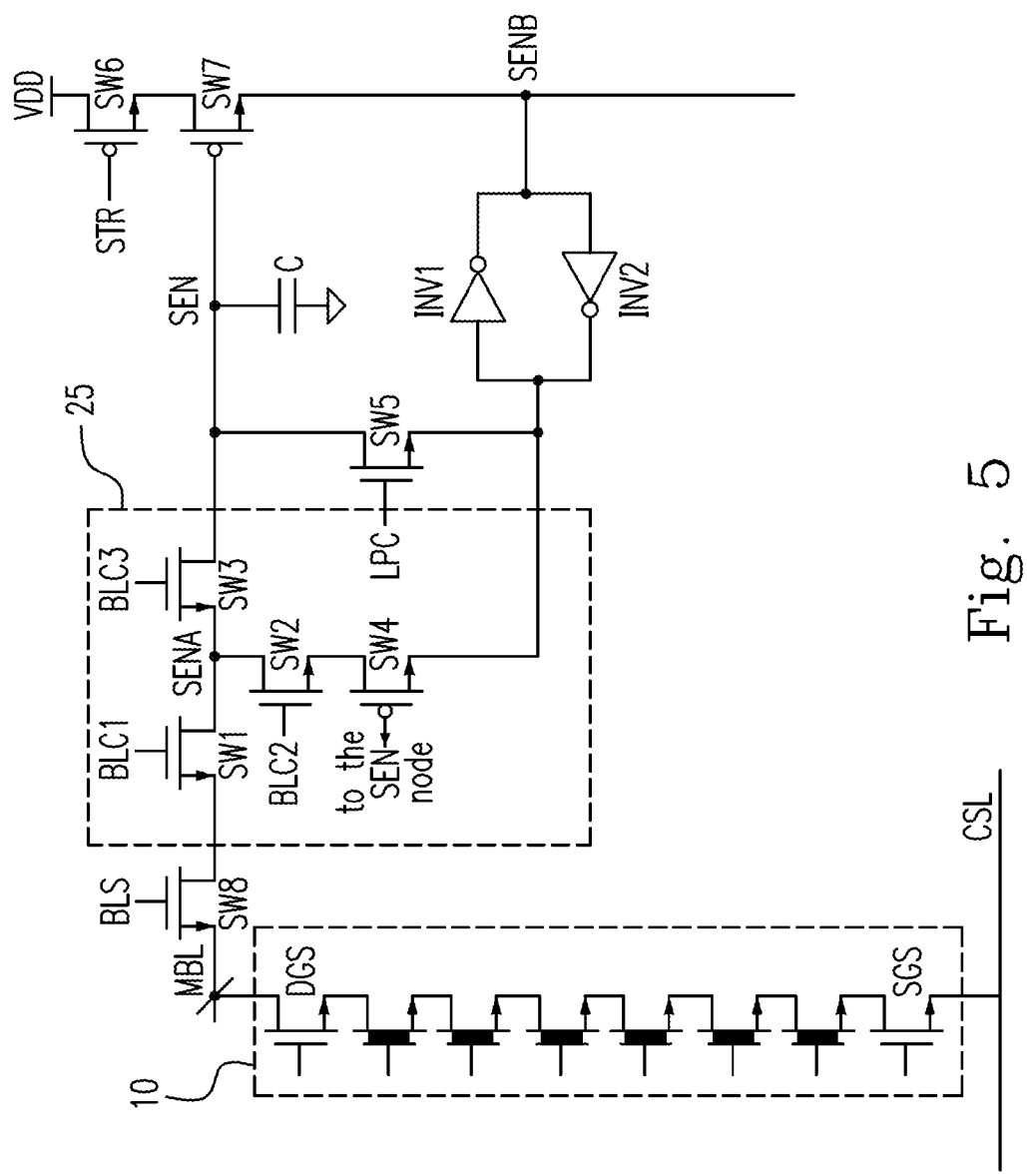
FIG. 5 is a circuit diagram of a sense amplifier and a NAND flash memory according to the fourth preferred embodiment of the present invention.

FIG. 5 shows a circuit diagram of a sense amplifier and a NAND flash memory according to the fourth preferred embodiment of the present invention. In FIG. 5, it shows the NAND flash memory 10 and a sense amplifier including a clamping circuit 25, which differs from the sense amplifier including the clamping circuit 21 in the prior art in that an auxiliary control switch sw4 is added. The switch sw4 is used to control a turn-on and a turn-off of the holding path sw8-sw1-sw2-sw4-the latch circuit more accurately.

Embodiments

1. A sense amplifier, comprising:
a first switch having a first terminal, a second terminal and a control terminal receiving a first bias;
a second switch having a first terminal electrically connected to the first terminal of the first switch, a second terminal and a control terminal receiving a second bias;
a third switch having a first terminal, a second terminal electrically connected to the first terminal of the first switch and a control terminal receiving a third bias;
a holding path including the second switch; and
a fourth switch controlling a turn-on and a turn-off of the holding path and having a first terminal electrically connected to the second terminal of the second switch, a second terminal and a control terminal receiving a sensing signal.

2. A sense amplifier according to embodiment 1, wherein the holding path pre-charges a memory, the first bias is different from the second bias, and the second bias equals to the third bias.

3. A sense amplifier according to embodiment 1 or 2 further comprising a sensing and pre-charging path having a sensing node, and a capacitor having a first and a second terminals, wherein the holding path pre-charges a memory, the first bias and the second bias are a first bit line bias and a second bit line bias respectively, the first terminal of the capacitor electrically connected to the sensing node and the first terminal of the third switch, and the second terminal of the capacitor connects a ground, the memory includes a bit line and a storage cell connected to the bit line, when the first and the third switches are turned on and a potential value of the sensing node has a relatively low value, the storage cell is in a conductive status, when the first and the third switches are turned on and the potential value of the sensing node has a relatively high value, the storage cell is in a non-conductive status, the potential value of the sensing node forms the sensing signal, when the second and the fourth switches are turned on, the holding path is conductive, and the bit line is pre-charged to a first predetermined potential value.

4. A sense amplifier according to any one of embodiments 1 to 3 further comprising a fifth to a eighth switches, each of which has a first, a second and a control terminals, a latch circuit has a first and a second terminals and two cross-connected inverters, and a strobe path, wherein the first terminal of the fifth switch connects the sensing node, the second terminal of the fifth switch connects the second terminal of the fourth switch and the first terminal of the latch circuit, the first terminal of the sixth switch receives a power supply voltage, the second terminal of the sixth switch connects the first terminal of the seventh switch, the second terminal of the seventh switch connects the second terminal of the latch circuit, the first terminal of the eighth switch connects the second terminal of the first switch, the second terminal of the eighth switch connects the bit line, the control terminal of the eight switch receives a bit line select signal such that the eight switch is selectively connected to a specific bit line, the potential value of the second terminal of the latch circuit is transferred to the sensing node when the fifth switch is turned on, the seventh switch is used to detect whether the sensing and pre-charging path is conductive, the sensing and pre-charging path connects the eight switch, the first switch, the third switch and the control terminal of the seventh switch, the holding path connects the eighth switch, the first switch, the second switch, the fourth switch and the latch circuit, and the strobe path connects the sixth switch, the seventh switch and the second terminal of the latch circuit.

5. A sense amplifier according to any one of embodiments 1 to 4 further comprising a ninth switch having a first, a second and a control terminals, wherein the first terminal of the ninth switch connects the second terminal of the fourth switch, the second terminal of the ninth switch connects the second terminal of the fifth switch, the control terminal of the ninth switch receives a fourth bias controlling the conducting time of the holding path, each of the fourth, the sixth and the seventh switches is a PMOS, and each of the first to the third, the fifth, the eighth and the ninth switches is an NMOS.

6. A sense amplifier according to any one of embodiments 1 to 4 further comprising a diode having an anode and a cathode and controlling the conduction time of the holding path, wherein the cathode of the diode is electrically connected to the second terminal to the fourth switch, and the anode of the diode is electrically connected to the second terminal of the fifth switch.

7. A sense amplifier according to any one of embodiments 1 to 3, wherein the memory is a flash memory, the bit line connects a drain gate select (DGS), a source gate select (SGS) and plural storage cells.

8. A sense amplifier according to any one of embodiments 1 to 7, wherein the flash memory is one of a NAND flash memory and a NOR flash memory.

9. A method for a sense amplifier, wherein the sense amplifier is the sense amplifier according to embodiment 5, comprising steps of:
 causing the holding path to be conductive when the second and the fourth switches are turned on, and pre-charging the bit line to the first predetermined value; and
 causing the sensing and pre-charging path to be conductive when the first and the third switches are turned on, wherein the potential value of the sensing node is a potential value of the storage cell.

10. A method according to embodiment 9, wherein the memory further comprises a word line electrically connected to the storage cell, and the step of causing conductive the holding path further comprises steps of:
 causing the value of first bias of the first switch to drop to zero to separate the bit line and the sense amplifier;
 adding a second predetermined potential value to the word line, wherein the storage cell generates a current and has a relatively low potential value when the storage cell is read and is in a conductive status and the storage cell does not generate any current and has a relatively high potential value when the storage cell is read and is in a non-conductive status;
 causing the sensing node to be pre-charged to a value of the power supply voltage, a charge sharing status between the sensing node and the bit line occurs such that a potential value of the sensing node becomes equal to that of the bit line when the read storage cell is in the conductive status, and the potential value of the sensing node remains at the power supply voltage when the read storage cell is in the non-conductive status; and
 causing the potential value of the second terminal of the latch circuit to be transferred to the sensing node so as to output the relatively high potential and the relatively low potential when the fifth switch is turned on.

11. A sense amplifier, comprising:
 a switch circuit having a main control switch, a sensing switch and a holding switch, wherein the three switches have a first bias, a second bias, and a third bias respectively; and
 an auxiliary control switch electrically connected to the holding switch to control an operation of the holding switch.

12. A sense amplifier according to embodiment 11 further comprising a sensing and pre-charging path including the main control switch and the sensing switch, sensing a potential value of a storage cell connected to a bit line of a memory and generating a sensing signal according to the potential value, wherein the switch circuit includes the main control, the sensing and the holding switches clamping the bit line according to the first to the third bias respectively.

13. A sense amplifier according to embodiment 11 or 12 further comprising a holding path including the holding switch and an auxiliary control switch electrically connected to the holding switch and receiving the sensing signal to control a turn-on and a turn-off of the holding path accordingly.

14. A sense amplifier according to any one of embodiments 11 to 13, wherein the memory is a flash memory.

15. A method for a sense amplifier, comprising steps of:
 forming a holding path including a main control switch and a holding switch; and
 providing an auxiliary control switch to control a turn-on and a turn-off of the holding path.

16. A method according to embodiment 15 further comprising steps of:
 forming a sensing and pre-charging path including the main control switch and a sensing switch;
 sensing a potential value of a storage cell connected to a bit line of a memory via the sensing and pre-charging path; and
 generating a sensing signal according to the potential value.

17. A method according to embodiment 15 or 16, wherein the step of providing an auxiliary control switch further comprising a step of controlling the turn-on and the turn-off of the holding path according to the sensing signal.

According to the aforementioned descriptions, the present invention provides a current sensing type sense amplifier having a better efficiency and a lower power loss, and the efficiency is raised, and the power loss is reduced via adding an auxiliary switch to control a holding path more accurately so as to possess the non-obviousness and the novelty.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims, which are to be accorded with the broadest interpretation so as to encompass all such modifications and similar structures. Therefore, the above description and illustration should not be taken as limiting the scope of the present invention which is defined by the appended claims.

What is claimed is:

1. A sense amplifier, comprising:
 a first switch having a first terminal, a second terminal and a control terminal receiving a first clamping bias;
 a second switch having a first terminal electrically connected to the first terminal of the first switch, a second terminal and a control terminal receiving a second clamping bias;
 a third switch having a first terminal, a second terminal electrically connected to the first terminal of the first switch and a control terminal receiving a third clamping bias;
 a holding path including the second switch;
 a sensing node having a sensed potential; and
 a fourth switch controlling a turn-on and a turn-off of the holding path and having a first terminal electrically connected to the second terminal of the second switch, a second terminal receiving a bias voltage, and a control terminal receiving the sensed potential.

2. A sense amplifier according to claim 1, wherein the first clamping bias is different from the second clamping bias, and the second clamping bias equals the third clamping bias.

3. A sense amplifier according to claim 1 further comprising
a sensing and pre-charging path having the sensing node, and
a capacitor having a first and a second terminals,
wherein the holding path pre-charges a memory, the first clamping bias and the second clamping bias are a first bit line clamping bias and a second bit line clamping bias respectively,
the first terminal of the capacitor is electrically connected to the sensing node and the first terminal of the third switch,
the second terminal of the capacitor connects a ground, the memory includes a bit line and a storage cell connected to the bit line,
when the first and the third switches are turned on and a potential value of the sensing node has a relatively low value, the storage cell is in a conductive status,
when the first and the third switches are turned on and the potential value of the sensing node has a relatively high value, the storage cell is in a non-conductive status, and the potential value of the sensing node forms the sensing signal, and
when the second and the fourth switches are turned on, the holding path is conductive, and the bit line is pre-charged to a first predetermined potential value.

4. A sense amplifier according to claim 3 further comprising a fifth to an eighth switches, each of which has a first, a second and a control terminals, a latch circuit has a first and a second terminals and two cross-connected inverters, and a strobe path, wherein the first terminal of the fifth switch connects the sensing node, the second terminal of the fifth switch connects the second terminal of the fourth switch and the first terminal of the latch circuit, the first terminal of the sixth switch receives a power supply voltage, the second terminal of the sixth switch connects the first terminal of the seventh switch, the second terminal of the seventh switch connects the second terminal of the latch circuit, the first terminal of the eighth switch connects the second terminal of the first switch, the second terminal of the eighth switch connects the bit line, the control terminal of the eighth switch receives a bit line select signal such that the eighth switch is selectively connected to a specific bit line, the potential value of the second terminal of the latch circuit is transferred to the sensing node when the fifth switch is turned on, the seventh switch is used to detect whether the sensing and pre-charging path is conductive, the sensing and pre-charging path connects the eighth switch, the first switch, the third switch and the control terminal of the seventh switch, the holding path connects the eighth switch, the first switch, the second switch, the fourth switch and the latch circuit, and the strobe path connects the sixth switch, the seventh switch and the second terminal of the latch circuit.

5. A sense amplifier according to claim 4 further comprising a ninth switch having a first, a second and a control terminals, wherein the first terminal of the ninth switch connects the second terminal of the fourth switch, the second terminal of the ninth switch connects the second terminal of the fifth switch, the control terminal of the ninth switch receives a fourth bias controlling the conducting time of the holding path, each of the fourth, the sixth and the seventh switches is a PMOS, and each of the first to the third, the fifth, the eighth and the ninth switches is an NMOS.

6. A sense amplifier according to claim 4 further comprising a diode having an anode and a cathode and controlling the conduction time of the holding path, wherein the cathode of the diode is electrically connected to the second terminal to the fourth switch, and the anode of the diode is electrically connected to the second terminal of the fifth switch.

7. A sense amplifier according to claim 3, wherein the memory is a flash memory, the bit line connects a drain gate select (DGS), a source gate select (SGS) and plural storage cells.

8. A sense amplifier according to claim 7, wherein the flash memory is one of a NAND flash memory and a NOR flash memory.

9. A method for operating a sense amplifier, comprising steps of:
forming a holding path including a main control switch and a holding switch; and
providing an auxiliary control switch to control a turn-on and a turn-off of the holding path,
wherein the sense amplifier is the sense amplifier as claimed in claim 5, the main control switch is the first switch, the holding switch is the second switch, the auxiliary control switch is the fourth switch, and the method further comprises steps of:
causing the holding path to be conductive when the second and the fourth switches are turned on; and
causing the sensing and pre-charging path to be conductive when the first and the third switches are turned on, and pre-charging the bit line to the first predetermined value via the sensing and pre-charging path, wherein the potential value of the sensing node is a potential value of the storage cell.

10. A method according to claim 9, wherein the memory further comprises a word line electrically connected to the storage cell, and the step of causing conductive the holding path further comprises steps of:
causing the value of first clamping bias of the first switch to drop to zero to separate the bit line and the sense amplifier;
adding a second predetermined potential value to the word line, wherein the storage cell generates a current and has a relatively low potential value when the storage cell is read and is in a conductive status and the storage cell does not generate any current and has a relatively high potential value when the storage cell is read and is in a non-conductive status;
causing the sensing node to be pre-charged to a value of the power supply voltage, a charge sharing status between the sensing node and the bit line occurs such that a potential value of the sensing node becomes equal to that of the bit line when the read storage cell is in the conductive status, and the potential value of the sensing node remains at the power supply voltage when the read storage cell is in the non-conductive status; and
causing the potential value of the second terminal of the latch circuit to be transferred to the sensing node so as to output the relatively high potential and the relatively low potential when the fifth switch is turned on.

11. A sense amplifier, comprising:
a switch circuit having a main control switch, a sensing switch and a holding switch, wherein the three switches have a first clamping bias, a second clamping bias, and a third clamping bias respectively, the main control switch and the holding switch form a holding path to pre-charge a memory, and the holding switch has a source;

a sensing node having a sensed potential; and an auxiliary control switch having a first terminal directly electrically connected to the source of the holding switch to control an operation of the holding switch, free from being directly electrically connected to at least one of a power supply and a common ground, a second terminal, and a control terminal receiving the sensed potential.

12. A sense amplifier according to claim 11 further comprising a sensing and pre-charging path including the main control switch and the sensing switch, sensing a potential value of a storage cell connected to a bit line of a memory and generating a sensing signal according to the potential value, wherein the switch circuit includes the main control, the sensing and the holding switches clamping the bit line according to the first to the third clamping bias respectively.

13. A sense amplifier according to claim 12 further comprising a holding path including the holding switch and the auxiliary control switch electrically connected to the holding switch and receiving the sensing signal to control a turn-on and a turn-off of the holding path accordingly.

14. A sense amplifier according to claim 12, wherein the memory is a flash memory.

15. A method for operating a sense amplifier, comprising steps of:

forming a holding path including a main control switch and a holding switch-having a source, wherein the holding path pre-charges a memory;

providing a sensing node having a sensed potential; and providing an auxiliary control switch having a first terminal directly electrically connected to the source of the holding switch to control a turn-on and a turn-off of the holding path, a second terminal receiving a bias voltage free from being directly electrically connected to at least one of a power supply and a common ground, and a control terminal receiving the sensed potential.

16. A method according to claim 15 further comprising steps of:

forming a sensing and pre-charging path including the main control switch and a sensing switch;

sensing a potential value of a storage cell connected to a bit line of a memory via the sensing and pre-charging path; and generating a sensing signal according to the potential value.

17. A method according to claim 16, wherein the step of providing an auxiliary control switch further comprises a step of controlling the turn-on and the turn-off of the holding path according to the sensing signal.

* * * * *